(12) United States Patent
Akram

(10) Patent No.: US 6,400,032 B1
(45) Date of Patent: *Jun. 4, 2002

(54) METHOD AND APPARATUS FOR PACKAGING FLIP CHIP BARE DIE ON PRINTED CIRCUIT BOARDS

(75) Inventor: Salman Akram, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/233,358

(22) Filed: Jan. 19, 1999

Related U.S. Application Data

(60) Continuation of application No. 08/956,143, filed on Oct. 22, 1997, now Pat. No. 5,898,224, which is a division of application No. 08/786,745, filed on Jan. 24, 1997, now Pat. No. 5,891,753.

(51) Int. Cl.[7] .............................................. H01L 29/40
(52) U.S. Cl. ....................................... 257/778; 257/660
(58) Field of Search ................................ 257/778, 659, 257/660, 787

(56) References Cited

U.S. PATENT DOCUMENTS

| | | |
|---|---|---|
| 4,081,825 A | 3/1978 | Koopman et al. |
| 4,628,406 A | 12/1986 | Smith et al. |
| 4,825,284 A | 4/1989 | Soga et al. |
| 4,873,615 A | 10/1989 | Grabbe |
| 5,081,067 A | 1/1992 | Shimizu et al. |
| 5,113,241 A | 5/1992 | Yanagida et al. |
| 5,201,866 A | 4/1993 | Mok |
| 5,218,234 A | 6/1993 | Thompson et al. |
| 5,239,200 A | 8/1993 | Messina et al. |
| 5,249,101 A | 9/1993 | Frey et al. |
| 5,289,346 A | 2/1994 | Carey et al. |
| 5,291,064 A | 3/1994 | Kurokawa |
| 5,371,404 A | 12/1994 | Juskey et al. |
| 5,379,191 A | 1/1995 | Carey et al. |
| 5,396,403 A | 3/1995 | Patel |
| 5,432,675 A | 7/1995 | Sorimachi et al. |
| 5,438,216 A | 8/1995 | Juskey et al. |
| 5,450,283 A | 9/1995 | Lin et al. |
| 5,468,995 A | 11/1995 | Higgins, III |
| 5,477,082 A | 12/1995 | Buckley, III et al. |
| 5,488,254 A | 1/1996 | Nishimura et al. |
| 5,489,801 A | 2/1996 | Blish, II |
| 5,610,442 A | 3/1997 | Schneider et al. |
| 5,656,857 A | 8/1997 | Kishita |
| 5,672,548 A | 9/1997 | Culnane et al. |
| 5,734,201 A | 3/1998 | Djennas et al. |
| 5,801,836 A | 9/1998 | Bakowski et al. |
| 5,959,362 A * | 9/1999 | Yoshino ..................... 257/778 |
| 5,969,426 A * | 10/1999 | Baba et al. ................. 257/778 |

* cited by examiner

*Primary Examiner*—Roy Potter
(74) *Attorney, Agent, or Firm*—TraskBritt

(57) ABSTRACT

An apparatus and a method for providing a fully protective package for a flip chip with a protective shield plate and an underfill encapsulant material. The apparatus comprises a semiconductor chip electrically connected by flip chip attachment to a substrate. A shield plate is placed in contact with a back surface of the semiconductor chip. An underfill encapsulant is disposed between the semiconductor chip and the shield plate, and the substrate. A glob top encapsulant may be applied about the periphery of the upper surface of the shield plate that extends to the substrate for additional protection and/or adherence.

10 Claims, 3 Drawing Sheets

METHOD AND APPARATUS FOR PACKAGING FLIP CHIP BARE DIE ON PRINTED CIRCUIT BOARDS

CROSS REFERENCE TO RELATED APPLICATION

This application is a continuation of application Ser. No. 08/956,143, filed Oct. 22, 1997, now U.S. Pat. No. 5,898,224, issued Apr. 27, 1999, which is a divisional of application Ser. No. 08/786,745, filed Jan. 24, 1997, now U.S. Pat. No. 5,891,753, issued Apr. 6, 1999.

BACKGROUND OF THE INVENTION

1. Field of the Invention

The present invention relates to an apparatus and a method for providing a protective cover plate for a packaged semiconductor chip. More particularly, the present invention relates to attaching a protective plate on a flip chip, wherein the protective plate may also serve as a heat sink.

2. State of the Art

Chip On Board ("COB") techniques are used to attach semiconductor dice to a printed circuit board, including flip chip attachment, wirebonding, and tape automated bonding ("TAB"). Flip chip attachment consists of attaching a flip chip to a printed circuit board or other substrate. A flip chip is a semiconductor chip that has a pattern or array of terminals spaced around an active surface of the flip chip for face down mounting of the flip chip to a substrate. Generally, the flip chip active surface has one of the following electrical connectors: Ball Grid Array ("BGA")—wherein an array of minute solder balls is disposed on the surface of a flip chip that attaches to the substrate ("the attachment surface"); Slightly Larger than Integrated Circuit Carrier ("SLICC")—which is similar to a BGA, but having a smaller solder ball pitch and diameter than a BGA; or a Pin Grid Array ("PGA")—wherein an array of small pins extends substantially perpendicularly from the attachment surface of a flip chip, such that the pins conform to a specific arrangement on a printed circuit board or other substrate for attachment thereto. With the BGA or SLICC, the solder or other conductive ball arrangement on the flip chip must be a mirror-image of the connecting bond pads on the printed circuit board so that precise connection is made. The flip chip is bonded to the printed circuit board by refluxing the solder balls. The solder balls may also be replaced with a conductive polymer. With the PGA, the pin arrangement of the flip chip must be a mirror-image of the pin recesses on the printed circuit board. After insertion, the flip chip is generally bonded by soldering the pins into place. A variation of the pin-in-recess PGA is a J-lead PGA, wherein the loops of the J's are soldered to pads on the surface of the circuit board.

Glob top and underfill materials are often used to hermetically seal the flip chips on the substrate. An underfill encapsulant is generally disposed between the semiconductor chip and the printed circuit board or substrate for environmental protection and to enhance the attachment of the semiconductor die to the substrate. In certain applications, only an underfill encapsulant is used in the semiconductor assembly without protecting the back surface of the semiconductor chip. The exposure of the semiconductor chip back surface leaves the semiconductor chip susceptible to damage. Furthermore, the application of the underfill encapsulant must be closely monitored. For example, too little underfill does not protect the device sufficiently enough from outside contamination and can give rise to a greater concentration of voids. Such voids can lead to the catastrophic failure of the chip. If too much underfill is used, the underfill encapsulant can rise to cover the edges of the chip, can expand or can spread out to adjacent areas of the board that do not require underfill.

Since the underfill encapsulant alone does not protect the back of the dice, an additional protection step of providing a glob top is typically used. As shown in FIG. 1, after assembly of a COB component 100, an underfill encapsulant 114 is generally placed between a semiconductor chip or flip chip 104 that is attached to a substrate 106 via a plurality of electrical connections 108 that extend between a plurality of semiconductor chip bond pads 110 and a corresponding plurality of substrate bond pads 112. The technique for applying the underfill encapsulant comprises dispensing the underfill encapsulant in a liquid form and allowing capillary action to draw it between the semiconductor chip 104 and the substrate 106. The underfill encapsulant then solidifies upon oven curing and reinforces all electrical connections 108. A variety of polymers can be used as underfill encapsulants, including thermosetting molding compounds such as silicones, epoxies, polyamides, and parylenes. A glob of encapsulant material 102 (usually epoxy or silicone or a combination thereof) is generally applied to the COB assembly 100 to surround the semiconductor chip 104 and the substrate 106. Organic resins generally used in the glob top encapsulation are usually selected for low moisture permeability and low thermal coefficient of expansion to avoid exposure of the encapsulated chip to moisture or mechanical stress, respectively. However, even though the chemical properties of these glob top materials have desirable properties for encapsulation, the thermal and electrical properties are often not optimal for removing heat efficiently away from the semiconductor dice or for use in high temperature areas. Furthermore, the addition of glob materials can induce detrimental stresses that can cause catastrophic failures. The stresses occur when the glob top is cured and has different mechanical characteristics such as an expansion coefficient compared to the underfill material.

Other techniques for protecting semiconductor dice include U.S. Pat. No. 5,432,676 which teaches a lid placed over a cavity containing a plurality of semiconductor dice and U.S. Pat. No. 5,477,082 which teaches a heat sink or non-heat-conductive covering to form a top surface of a module.

Every semiconductor chip in a COB assembly generates heat during operation. Some glob tops and package encapsulation materials may serve to draw the heat away from most semiconductor chips. Indeed, one factor in choosing a package encapsulation material is its thermal dissipation properties. If the operating temperature of the semiconductor chip is not controlled or accommodated, reliability problems of the chip or system in which the chip is installed may occur due to excess temperature rise during operation. The device/semiconductor junction temperature (the location of the heat source due to power dissipation) must be maintained below a predetermined limiting value, typically such as 85° C. The primary reason to control device/semiconductor junction temperature is that the performance of the device is a sensitive function of device temperature. In addition, various failure mechanisms are thermally activated, and failure rates become excessive above the desired temperature limit, causing reliability concerns. Furthermore, it is important to control the variation in device operating temperature across all the devices in the system. This is also due to the temperature sensitivity of switching voltage, since too large a variation from device to device would increase the voltage range over which switching occurs, leading to switching errors due to noise and power-supply fluctuations. Moreover, the fluctuations in temperature cause differential thermal expansions that give rise to a fatigue process that can lead to cracks occurring in the COB assembly during burn-in or general operation.

Thus, high heat producing semiconductor dice, such as a microprocessor, may require adjustments in size of the COB assembly and will often require the addition of metal heat-dissipating fins, blocks, or the like on the package. Referring to drawing FIG. 2, a finned COB assembly 200 is illustrated. The finned COB assembly 200 comprises a semiconductor chip or flip chip 202 which is attached to a substrate 204 via a plurality of electrical connections 206 which extend between a plurality of semiconductor chip bond pads 208 and a corresponding plurality of substrate bond pads 210. An underfill encapsulant 212 is disposed between the semiconductor chip 202 and the substrate 204. A cap 214 having a plurality of heat-dissipating fins 216 is attached to an upper surface 218 of the semiconductor chip 202 with a layer of thermally conductive adhesive 220. U.S. Pat. No. 5,396,403 issued Mar. 7, 1995 to Patel illustrates a finned heat sink arrangement. The arrangement comprises a plurality of semiconductor chips attached to a thermally conductive plate with a thermally conductive paste. The thermally conductive plate is in turn connected to a finned heat sink with a thermally conductive paste. However, the addition of heat-dissipating fins or the like substantially increases the cost of production for COB assemblies.

Simpler heat dissipation methods have been attempted. U.S. Pat. No. 5,488,254 issued Jan. 30, 1996 to Nishimura et al. and U.S. Pat. No. 5,489,801 issued Feb. 6, 1996 to Blish relate to encasing a heat slug (a piece of heat conducting material) in the encapsulation material. Although each of these patents attempts to address the problems of potential differences in the thermal coefficient of expansion between the heat slug and the encapsulation material, these attempts are never entirely successful and the adhesion interfaces between the heat slug and the encapsulation material may become separated, allowing moisture to reach and destroy the encased semiconductor chip.

Therefore, it would be advantageous to develop a technique and assembly for inexpensively forming a protection shield on a semiconductor chip in combination with comrnercially-available, widely-practiced semiconductor device fabrication techniques. It would also be advantageous if the protective shield also served as a heat dissipation mechanism, and also reduced expansion differences between the underfill and gob top material conventionally used for encapsulation.

BRIEF SUMMARY OF THE INVENTION

The present invention relates to an apparatus and method for providing a fully protective package for a flip chip with only a protective plate and an underfill material. The apparatus is constructed by providing a semiconductor chip having a plurality of bond pads on an active surface and a substrate having a plurality of bond pads on an active surface which are the mirror-image of the bonds pads of the semiconductor chip. The substrate may be made of ceramic, silicon, flexible film, polyamide, MCM-L, MCMD-FR4, or similar materials. A plurality of electric connections forms an electrical communication between the semiconductor chip bond pads and the substrate bond pads. The electric connection may be solder balls, conductive polymers, or the like. Each substrate bond pad is connected to a trace lead which is in or on the substrate. The trace leads form the electrical communication between the semiconductor chip and external circuitry.

A shield plate is placed in contact with a back surface of the semiconductor chip. The shield plate may be made out of inexpensive polypropylene or other polymers or plastic material (transparent or opaque). However, when the semiconductor chip generates a substantial amount of heat, the shield plate can be made out of a conductive material, such as a metal-like aluminum, for example, ceramic, or the like, so that it serves as a heat sink. An underfill encapsulant is disposed between the semiconductor chip and the shield plate, and the substrate. A layer of adhesive may be disposed between the shield plate and the semiconductor chip back surface. However, the layer of adhesive is not necessary if the underfill encapsulant has sufficient adhesion properties to adhere the shield plate to the substrate.

Although the underfill encapsulant may have adequate properties to adhere the shield plate and semiconductor chip to the substrate, the underfill encapsulant may not have sufficient contaminant protecting properties, or vice versa. If the underfill encapsulant is lacking in adequate adherence and/or protective properties, a glob top encapsulant may be applied about the periphery of the upper surface of the shield plate, wherein the glob top encapsulant extends to the substrate. Preferably, the underfill encapsulant is recessed a distance from a periphery edge of the shield plate. This recess allows the glob top encapsulant to fill the recess distance between a shield plate periphery lower surface and the substrate upper surface.

Thus, the apparatus of the present invention achieves inexpensive protection of the semiconductor chip and, if required, heat dissipation with a simple and cost-effective process.

The advantages of the present invention are reduced stresses and/or bending from minimizing or eliminating glob top material, easier rework of the die connected to the substrate, higher mounted die densities on the substrate, better underfill seals of the die to the substrate, no fence required to contain the underfill during application, and better thermal/mechanical properties than the sole use of glob top materials.

BRIEF DESCRIPTION OF THE SEVERAL VIEWS OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

DETAILED DESCRIPTION OF THE INVENTION

Figure 1:
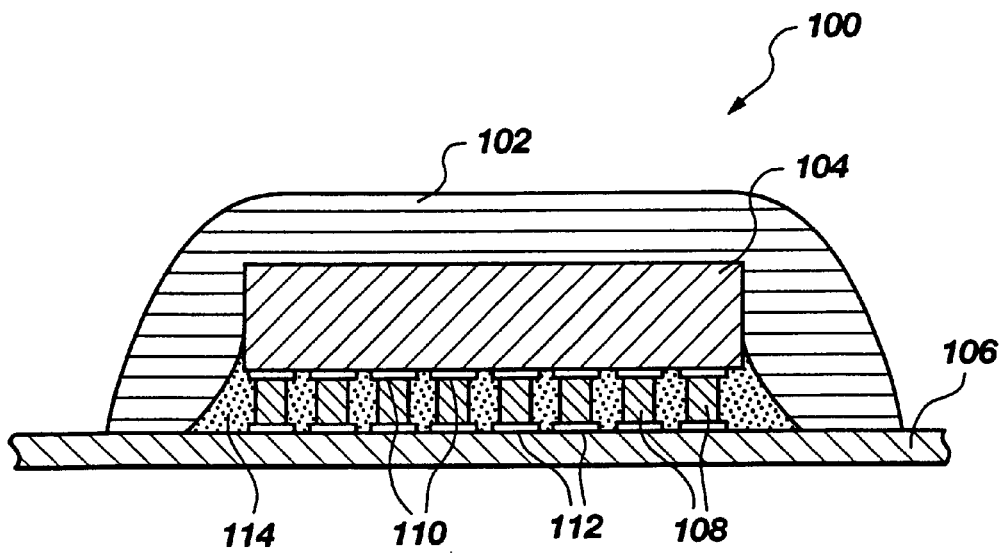
FIG. 1 is a side cross-sectional view of a prior art glob top encapsulated semiconductor chip attached on a substrate.
Figure 2:
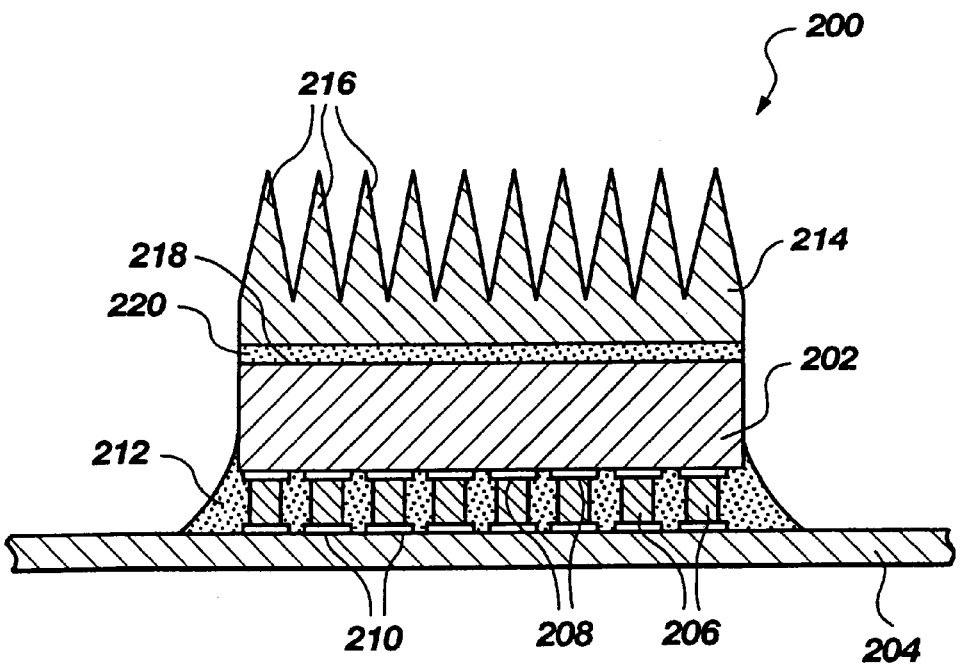
FIG. 2 is a side cross-sectional view of a prior art semiconductor assembly with heat-dissipating fins attached to a substrate.
Figure 3:
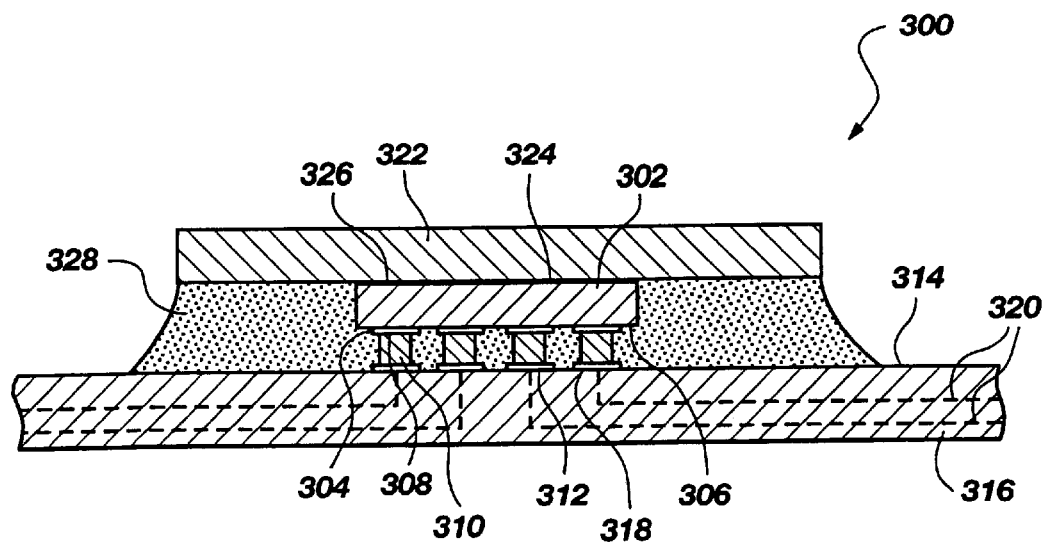
FIG. 3 is a side cross-sectional view of a first shielded semiconductor assembly of the present invention.

FIG. 3 illustrates a first shielded semiconductor assembly 300 of the present invention. The first shielded semiconductor assembly 300 comprises a flip chip or semiconductor chip 302 having a plurality of bond pads 304 on an active surface 306 of the semiconductor chip 302. A facing surface 308 of each bond pad 304 has an electrical connection 310 in electrical communication therewith. The electrical connections 310 are in electrical communication with a plurality of respective bond pads 312 on an upper surface 314 of a substrate 316. Each substrate bond pad 312 is connected on a lower bond pad surface 318 to a trace lead 320 (shown by a dashed line). A shield plate 322 contacts a back surface 324 of the semiconductor chip 302. The shield plate 322 may be attached to the semiconductor chip back surface 324 with a layer of adhesive 326. The adhesive may be of any suitable type for use with the predetermined material of the shield plate 322 and substrate 316. An underfill encapsulant 328 of any suitable type is disposed between the semiconductor chip 302 and the substrate 316.

Figure 4:
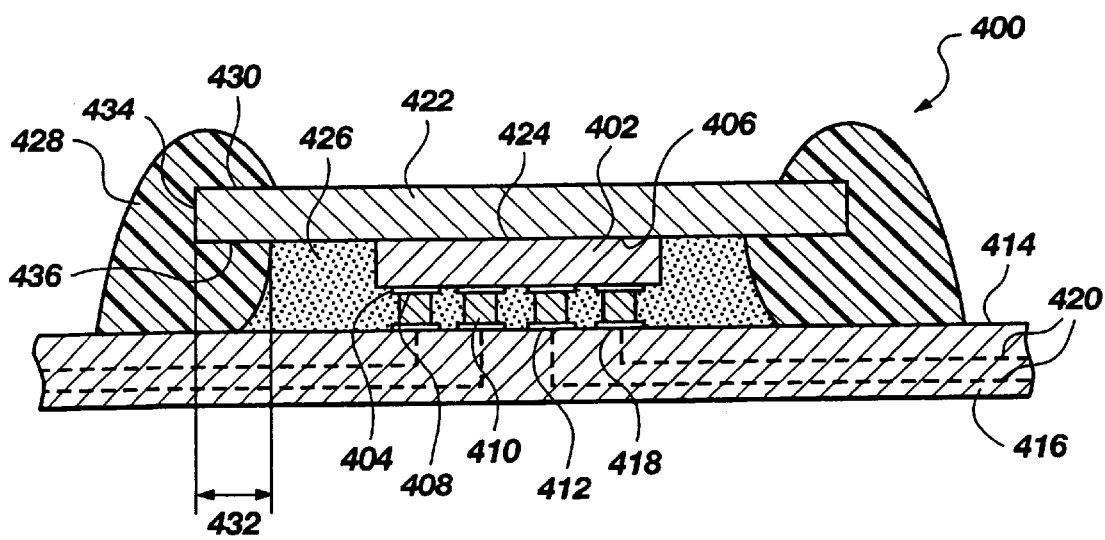
FIG. 4 is a side cross-sectional view of a second shielded semiconductor assembly of the present invention.

FIG. 4 illustrates a second shielded semiconductor assembly 400 of the present invention. The second shielded semiconductor assembly 400 comprises a flip chip or semiconductor chip 402 having a plurality of bond pads 404 on an active surface 406 of the semiconductor chip 402. A facing surface 408 of each bond pad 404 has an electrical connection 410 in electrical communication therewith. The electrical connections 410 are in electrical communication with a plurality of respective bond pads 412 on an upper surface 414 of a substrate 416. Each substrate bond pad 412 is connected on a lower bond pad surface 418 to a trace lead 420 (shown by a dashed line). A shield plate 422 contacts a back surface 424 of the semiconductor chip 402. An underfill encapsulant 426 is disposed between the semiconductor chip 402 and the substrate 416. A glob top encapsulant 428, or any other suitable material having the desired heat transfer characteristics, is disposed on an upper surface periphery 430 of the shield plate 422 and extends to the substrate upper surface 414. Preferably, the underfill encapsulant 426 is recessed a distance 432 from a periphery edge 434 of the shield plate 422 that allows the glob top encapsulant 428 to fill the recess distance 432 between a shield plate periphery lower surface 436 and the substrate upper surface 414. In this second shielded semiconductor assembly of the present invention, an underfill encapsulant 426 that has good mechanical properties as an underfill but has only acceptable sealing properties may be used. In this instance, the glob top encapsulant 428 is used to seal the semiconductor chip 402. Also, depending upon the judicious selection of the underfill encapsulant 426 and the glob top encapsulant 428, both may act as good moisture sealants, if desired.

Figure 5:
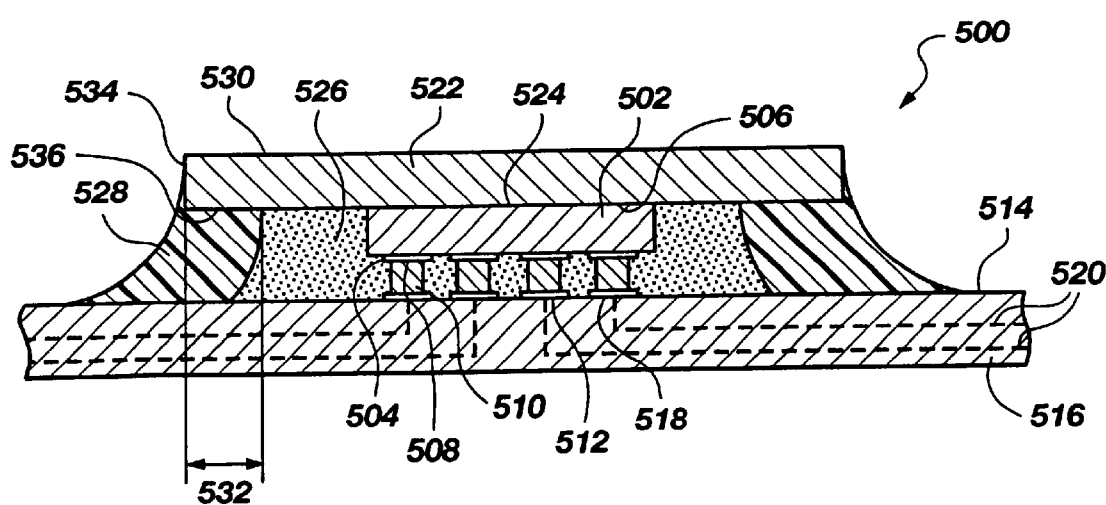
FIG. 5 is a side cross-sectional view of a third shielded semiconductor assembly of the present invention.

FIG. 5 illustrates a third shielded semiconductor assembly 500 of the present invention. The third shielded semiconductor assembly 500 comprises a flip chip or semiconductor chip 502 having a plurality of bond pads 504 on an active surface 506 of the semiconductor chip 502. A facing surface 508 of each bond pad 504 has an electrical connection 510 in electrical communication therewith. The electrical connections 510 are in electrical communication with a plurality of respective bond pads 512 on an upper surface 514 of a substrate 516. Each substrate bond pad 512 is connected on a lower bond pad surface 518 to a trace lead 520 (shown by a dashed line). A shield plate 522 contacts a back surface 524 of the semiconductor chip 502. An underfill encapsulant 526 is disposed between the semiconductor chip 502 and the substrate 516. A heat sink type glob top encapsulant 528, or any other suitable material having the desired heat transfer characteristics, is disposed on an upper surface periphery 530 of the shield plate 522 and extends to the substrate upper surface 514. Preferably, the underfill encapsulant 526 is recessed a distance 532 from a periphery edge 534 of the shield plate 522 that allows the heat sink type glob top encapsulant 528 to fill the recess distance 532 between a shield plate periphery lower surface 536 and the substrate upper surface 514. In this third shielded semiconductor assembly of the present invention, an underfill encapsulant 526 that has good mechanical properties and acceptable sealing properties may be used. In this instance, the heat sink type glob top encapsulant 528 is used to seal the semiconductor chip 502 and help transfer heat therefrom during operation. Also, depending upon the judicious selection of the underfill encapsulant 526 and the heat sink type glob top encapsulant 528, both may act as good moisture sealants as well as heat sink type glob top encapsulant 528 providing heat transfer from the semiconductor chip 502.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A semiconductor assembly comprising:
   a substrate;
   a semiconductor chip having a first surface and a second surface, wherein the first surface is attached to and in electrical communication with said substrate;
   a shield plate having a first surface and a second surface wherein the first surface of said shield plate contacts the second surface of said semiconductor chip;
   an underfill encapsulant disposed between the first surface of said semiconductor chip and the first surface of said shield plate and said substrate; and
   glob top material disposed on substantially the periphery of the second surface of said shield plate, said glob top material extending and contacting said substrate.

2. The semiconductor assembly of claim 1, wherein said shield plate includes one of polymeric material and plastic material.

3. The semiconductor assembly of claim 1, wherein the thermal conductivity of said shield plate is greater than said semiconductor chip.

4. The semiconductor assembly of claim 3, wherein said shield plate includes one of metal, thermal conductive ceramic, and other thermally conductive material comprising metals, ceramics and combinations thereof.

5. A semiconductor assembly comprising:
   a substrate;
   a semiconductor chip having a first surface and a second surface, wherein the first surface is attached to and in electrical communication with said substrate;
   a shield plate having a first surface and a second surface wherein the first surface of said shield plate contacts the second surface of said semiconductor chip;
   an underfill encapsulant disposed between the first surface of said semiconductor chip and the first surface of said shield plate and said substrate; and
   a glob top material disposed on the periphery of the second surface of said shield plate, wherein said glob top material extends and contacts said substrate.

6. The semiconductor assembly of claim 5, wherein said glob top material extends under a portion of said shield plate first surface.

7. The semiconductor assembly of claim 5, wherein said glob top material extends under a portion of said shield plate first surface transferring heat from the semiconductor chip.

8. A semiconductor assembly comprising:

a substrate;

a semiconductor chip having a first surface and a second surface, wherein the first surface is attached to and in electrical communication with said substrate;

a shield plate having a first surface and a second surface wherein the first surface of said shield plate first contacts the second surface of said semiconductor chip;

an underfill encapsulant disposed between the first surface of said semiconductor chip and the first surface of said shield plate and said substrate; and a glob top material disposed on the periphery of the second surface of said shield plate, said glob top material extending and contacting a portion of said substrate.

9. The semiconductor assembly of claim 8, wherein said glob top material extends under a portion of the first surface of said shield plate.

10. The semiconductor assembly of claim 9, wherein said glob top material extends under a portion of the first surface of said shield plate transferring heat therefrom.

* * * * *

UNITED STATES PATENT AND TRADEMARK OFFICE
CERTIFICATE OF CORRECTION

PATENT NO.      : 6,400,032 B1
APPLICATION NO. : 09/233358
DATED           : June 4, 2003
INVENTOR(S)     : Salman Akram It is certified that error appears in the above-identified patent and that said Letters Patent is hereby corrected as shown below:

In the specification:

COLUMN 3, LINE 45, change "comrnercially-available" to --commercially-available--

Signed and Sealed this

Twenty-third Day of October, 2007

JON W. DUDAS
*Director of the United States Patent and Trademark Office*

UNITED STATES PATENT AND TRADEMARK OFFICE
CERTIFICATE OF CORRECTION

PATENT NO. : 6,400,032 B1  Page 1 of 1
APPLICATION NO. : 09/233358
DATED : June 4, 2002
INVENTOR(S) : Salman Akram It is certified that error appears in the above-identified patent and that said Letters Patent is hereby corrected as shown below:

In the specification:

COLUMN 3, LINE 45, change "comrnercially-available" to --commercially-available--

This certificate supersedes the Certificate of Correction issued October 23, 2007.

Signed and Sealed this

Fifteenth Day of January, 2008

JON W. DUDAS
*Director of the United States Patent and Trademark Office*